United States Patent
Ali

(10) Patent No.: US 8,836,558 B1
(45) Date of Patent: Sep. 16, 2014

(54) METHOD AND DEVICE FOR IMPROVING CONVERGENCE TIME IN CORRELATION-BASED ALGORITHMS

(71) Applicant: Ahmed Mohamed Abdelatty Ali, Oak Ridge, NC (US)

(72) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/897,604

(22) Filed: May 20, 2013

Related U.S. Application Data

(60) Provisional application No. 61/791,279, filed on Mar. 15, 2013.

(51) Int. Cl.
*H03M 1/00* (2006.01)
*H03M 1/10* (2006.01)
*H03M 1/06* (2006.01)
*H03M 1/12* (2006.01)

(52) U.S. Cl.
CPC .......... *H03M 1/1071* (2013.01); *H03M 1/0695* (2013.01); *H03M 1/12* (2013.01); *H03M 1/00* (2013.01); *H03M 2201/4135* (2013.01)
USPC .......................................... 341/132; 341/120

(58) Field of Classification Search
CPC . H03M 2201/4135; H03M 1/12; H03M 1/00; H03M 1/0695
USPC ......... 341/132, 120, 118, 110, 158, 155, 162, 341/161
See application file for complete search history.

(56) References Cited

U.S. PATENT DOCUMENTS 8,493,259 B2 * 7/2013 Lai et al. ...................... 341/162

* cited by examiner

*Primary Examiner* — Joseph Lauture
(74) *Attorney, Agent, or Firm* — Kenyon & Kenyon, LLP

(57) ABSTRACT

A method and a corresponding device reduce the convergence time of a correlation algorithm that uses random signals injected into an analog-to-digital converter (ADC) as input to the algorithm. The method and device involve, at a processor of a pipelined ADC, injecting a random signal into each of a plurality of stages in the pipeline and obtaining digital values generated in response to the random signals. Noise components of residue signals in the plurality of stages are calculated as a function of the digital values and values of the random signals. The noise components correspond to the random signals.

14 Claims, 4 Drawing Sheets

US 8,836,558 B1

METHOD AND DEVICE FOR IMPROVING CONVERGENCE TIME IN CORRELATION-BASED ALGORITHMS

CROSS-REFERENCE TO RELATED APPLICATIONS

This application claims the benefit, under 35 U.S.C. §119 (e), of U.S. Provisional Patent Application No. 61/791,279 filed Mar. 15, 2013, the content of which is hereby incorporated by reference in its entirety.

BACKGROUND INFORMATION

Random signal sequences are sometimes injected into circuits. The randomness of the sequences may refer to the amplitude of the signals in the sequences, which may, for example, randomly vary between a set of discrete, predefined values. These sequences may be uncorrelated with the input signals to the circuits, i.e., the useful signals. The sequences may also be uncorrelated with each other. The sequences can be used for a variety of purposes, which are known in the art. For example, random sequences may be used to calibrate one or more stages of a pipelined analog-to-digital converter (ADC), e.g., to reduce a degree of mismatch between the devices in the stages or correct for non-linearity errors. Random sequences may also be used for dithering the input signal or for performing other types of calibrations. For convenience, these random or pseudo-random sequences will be referred to herein as "dither" signals, even though they may not be used to perform dithering in the traditional sense.

In a pipelined ADC, it may be desirable to remove the dither signals from the output of the ADC. This may be difficult because dither injected into one stage may propagate through subsequent stages, thereby influencing the signals output from one stage to the next, and may ultimately influence the overall output as well. Dither signals also experience the same gain effects as the input signals applied to the stages into which the dither is injected. Therefore, removal of the dither signals is not as straightforward as simply subtracting the dither injected into a stage from the output of that stage.

One method of removing dither signals from the output of the ADC is to correlate them out where they are used, by taking advantage of the lack of correlation between the dither signals. For example, if one sequence is used to calibrate stage 1 in a pipelined ADC, while other sequences are used to calibrate other stages, and/or to dither the pipeline, a correlation algorithm such as a Least Means Square (LMS) algorithm may be applied to correlate the overall output of the ADC with the sequence injected into stage 1 to determine a degree of correlation between the injected sequence and the overall output (which includes all the sequences). In a similar fashion, the degree of correlation between the sequences injected into other stages and the overall output may be determined. The output of each stage is then adjusted based on the degree of correlation for the respective stage so that, over time, the error attributed to the sequences is gradually reduced so that the sequences will average out to zero, while the intended sequence, i.e., the useful signal corresponding to the analog input of the ADC, remains. However, the convergence time of the correlation algorithm can be very long, even in the absence of any input signal, e.g., when the input is disconnected and only the random sequences are injected. This leads to long start-up times and long production test times, which can be prohibitive.

Accordingly, a need exists for methods of improving the convergence time of correlation algorithms in the context of injected dither signals.

DETAILED DESCRIPTION

Example embodiments of the present invention relate to improving the convergence time in correlation-based algorithms that are applied to random or pseudorandom signal sequences injected simultaneously into an ADC. The convergence time may be reduced by reconstructing an estimate of the dither signals and subtracting them out, before applying the correlation algorithm on the desired sequence. This substantially reduces the "energy" of the undesired sequences and hence improves the convergence time significantly. Thus, instead of relying on the correlation algorithm alone to remove the sequences, a substantial portion of the sequences may be removed, e.g., using subtraction, prior to applying the correlation algorithm.

Example embodiments are described in connection with a pipelined ADC. However, it will be understood that the embodiments may also be applicable to other circuits in which dither signals are injected simultaneously into a plurality of locations in the circuit.

Figure 1:
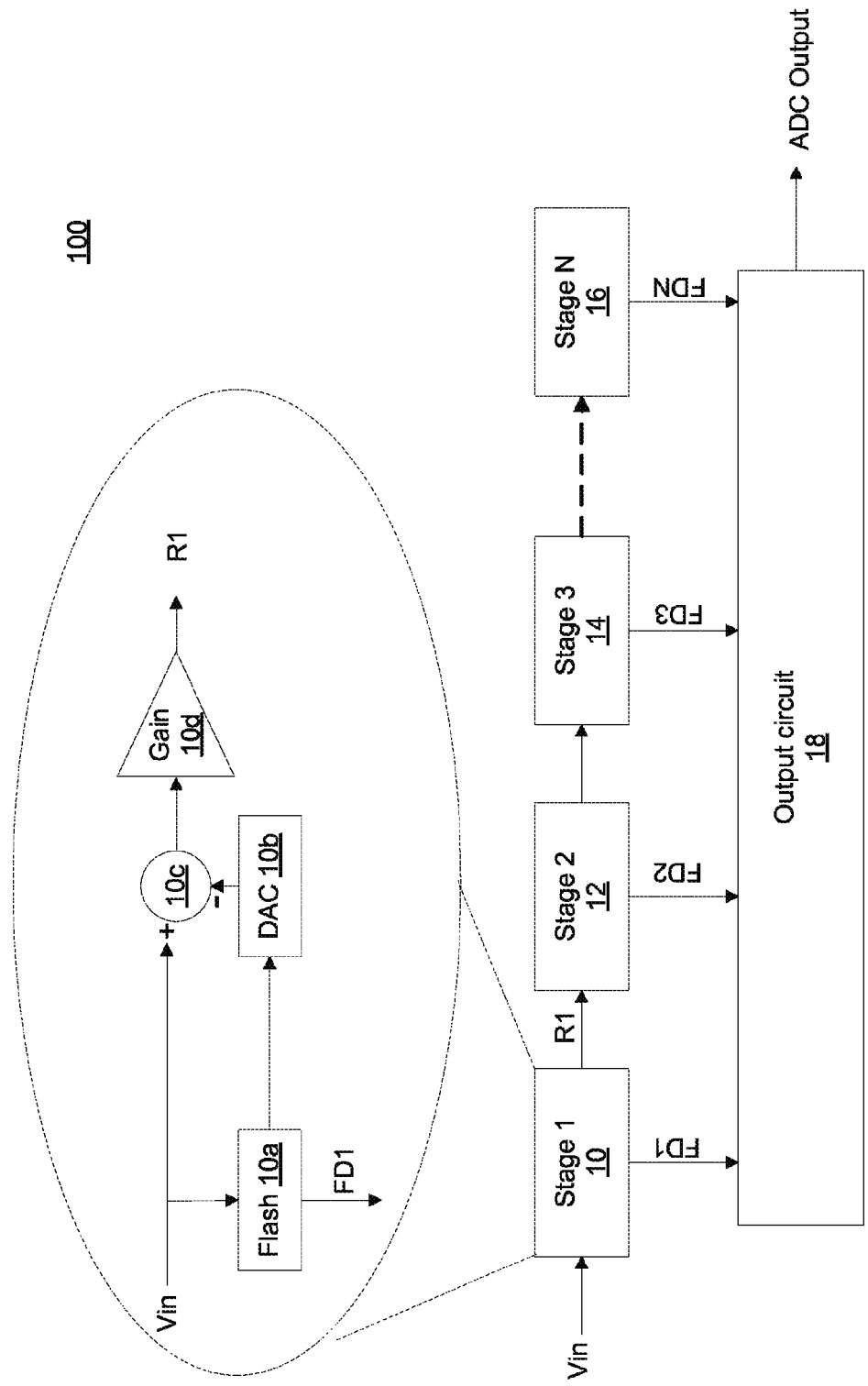
FIG. 1 is a block diagram of a multi-stage pipelined ADC.

FIG. 1 is a block diagram of a multi-stage pipelined ADC 100. An analog signal Vin is input to a first stage 10 of the ADC. Within a flash portion of each stage, a comparison between the input and a set of reference voltages may be performed by a bank of comparators, resulting in a coarse digital estimate of the input, which is output to an output circuit 18 to which all the stages are connected. The coarse estimate is also accurately converted into a voltage and subtracted from the input with the aid of a digital-to-analog converter (DAC) and subtraction circuitry. The resulting analog residue signal is gained-up and provided as input to the next stage. This is repeated through any number of additional stages (e.g., stages 12 and 14) until the end of the pipeline (the final stage 16) is reached. The number of stages can be selected based on a desired resolution of the ADC.

FIG. 1 includes a blow-up view showing various components of the stage 10. Each of the remaining stages 12/14/16 may include similar components, except the final stage 16 may not include a digital-to-analog converter (DAC) or a subtraction unit. The input Vin is passed to a flash unit 10a, which performs an analog-to-digital conversion of Vin to generate a digital value FD1. Vin may be applied to a set of comparators in the flash unit 10a. Depending on the value of Vin, any number of comparators may be triggered to generate a digital approximation of Vin, since each comparator may have a different triggering threshold. FD1 is input to a DAC 10b, which converts FD1 into an analog signal. The analog version of FD1 may then be subtracted from Vin by a subtraction unit 10c, before being gained-up by a gain unit 10d and passed to the next stage (e.g., stage 12) as an analog residue signal R1. This process may be repeated until the end of the pipeline is reached. The overall output of the ADC is then generated by an output circuit 18, which combines the digital output of each stage (e.g., FD1, FD2 ... FDN) into a single digital output (ADC Output). Since the stages operate in a pipelined fashion, the FD signals from each stage are appropriately delayed (e.g., by the output circuit 18) so that all the output signals from the same sample instant are time-aligned. The output circuit 18 may then generate the ADC Output by combining the time-aligned signals, e.g., as a digital summation of the time-aligned signals.

Figure 2:
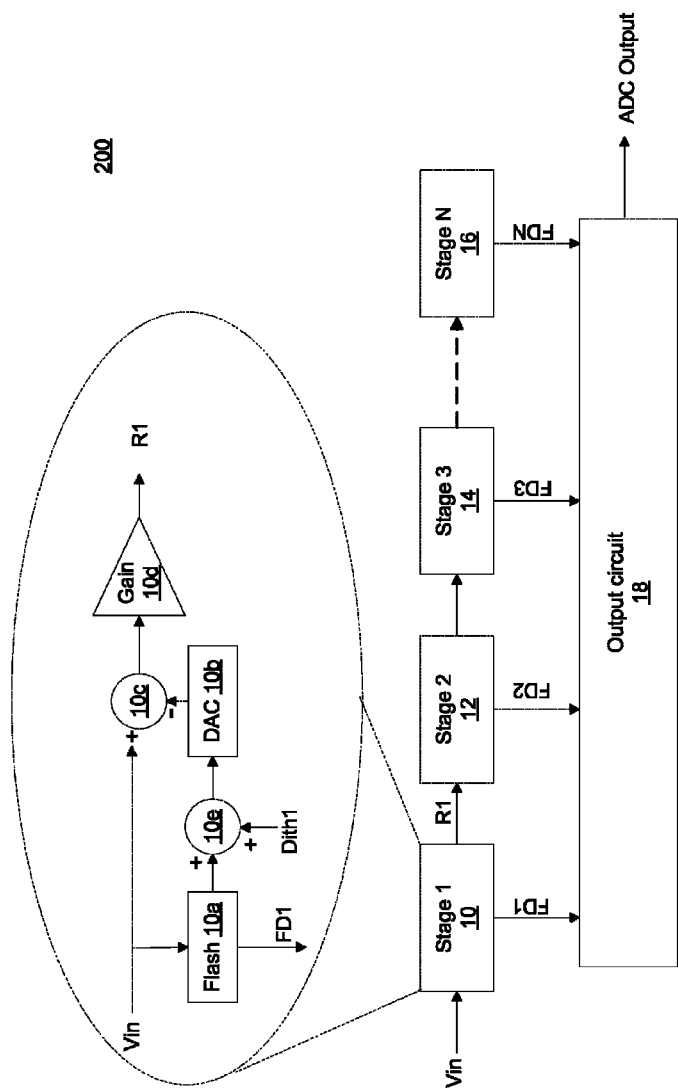
FIG. 2 is a block diagram of a multi-stage pipelined ADC with dither injection.

FIG. 2 is a block diagram of a multi-stage pipelined ADC 200 with dither injection. The components may be identical to those discussed in connection with the ADC 100 of FIG. 1, except that each stage may additionally include a hardware arrangement for injecting dither into the stage. In the blow-up view of stage 10, this arrangement is shown as an addition unit 10e that sums the digital output of the flash 10a with a dither signal Dith1. It will be understood, however, that other forms of dither injection may be used. For example, in another embodiment, the dither may be injected directly into the DAC 10b. Further, the hardware arrangement for combining the dither with an existing signal in the stage need not be an addition unit, but may, for example, utilize existing components such as capacitors in the DAC 10b.

Figure 3:
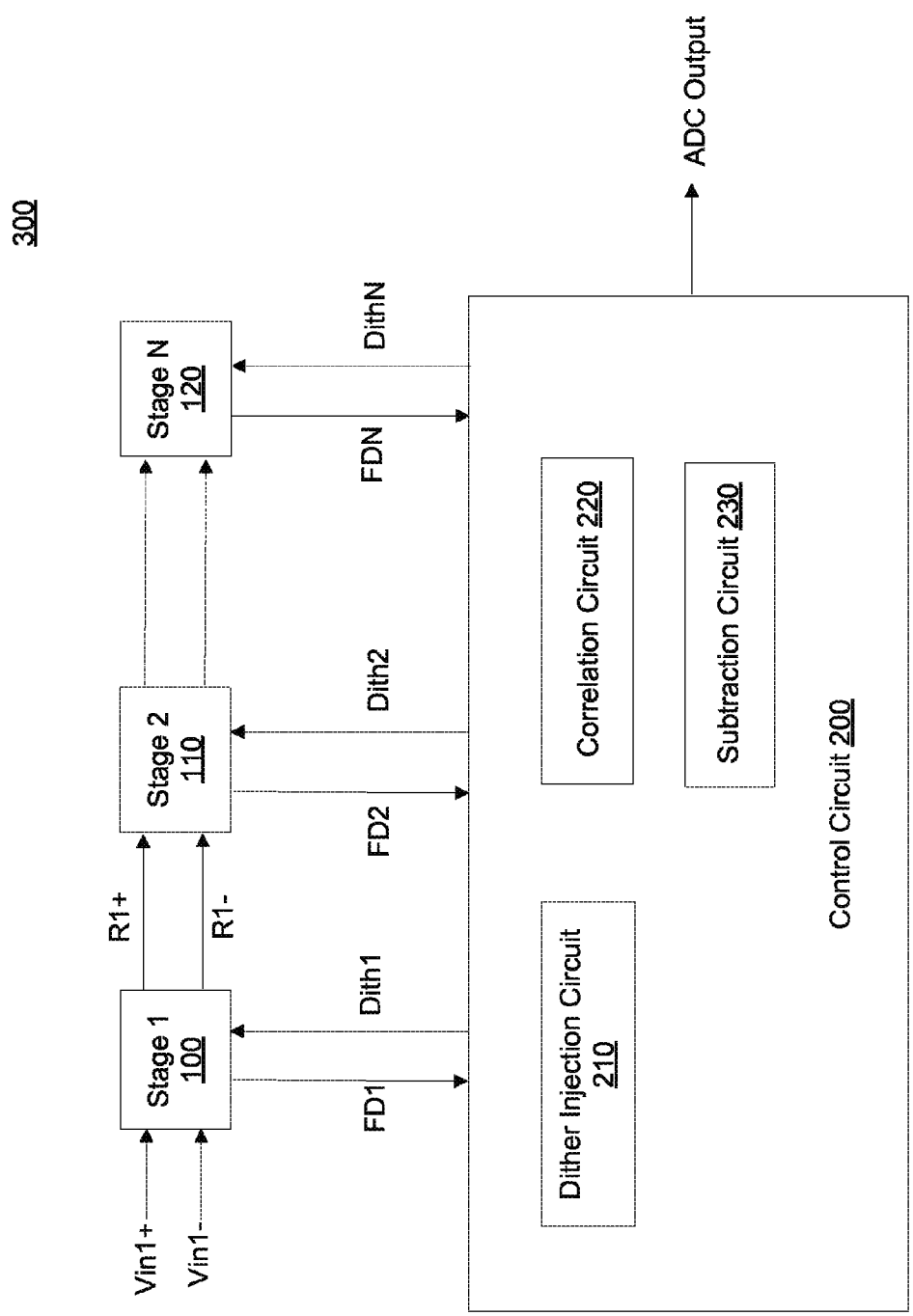
FIG. 3 is a block diagram of a system according to an example embodiment of the present invention.

FIG. 3 is a block diagram of a system 300 according to an example embodiment of the present invention. The system may include a plurality of pipelined stages 100/110/120 and a control circuit 200. The stages 100/110/120 may be similar in structure to the stages previously described in connection with FIGS. 1 and 2. The ADC in the system 300 may operate on a differential input. For this reason, two input signals Vin+ and Vin− are shown.

The control circuit 200 may be analogous to the output circuit 18 in FIGS. 1 and 2 in that the control circuit 200 may be configured to combine the digital outputs from the flashes in each stage to form the overall output. This is illustrated in FIG. 3 by presence of the ADC Output signal at an output of the control circuit 200. However, in alternative embodiments, the control circuit 200 may be used in conjunction with a separate output circuit that performs the combining. Similarly, each of the block components in the control circuit 200 may be implemented as a separate device.

The control circuit 200 may include a dither injection circuit, a correlation circuit 220 and a subtraction circuit 230. The dither injection circuit 210 may include a circuit arrangement for generating and injecting dither into each stage. This circuit arrangement may determine the values of the dither signals, e.g., by implementing a function that randomly selects a value from a set of discrete, predefined values.

The correlation circuit 220 may implement a correlation algorithm such as LMS to correlate the overall output of the ADC, i.e., ADC Output, to each of the dither signals (Dith1, Dith2, Dith3, etc.).

The subtraction circuit 230 may implement a method for improving the convergence time of the correlation algorithm of the correlation circuit 220. An example embodiment of this method will be described with reference to FIG. 4. The subtraction circuit 230 may include a processor that performs calculations to estimate the ideal amplitudes of the unwanted portions of the residue signals, which unwanted portions correspond to the dither signals, and then subtracts the unwanted portions, which may be considered as a form of noise, before the correlation algorithm is executed. The estimates may be subject to non-idealities in the pipeline, to which non-idealities the input Vin is also subject. However, for purposes of improving the convergence time, the estimates produced by the subtraction circuit 230 are reasonably close enough that the amplitude of the dither signals may be reduced by at least an order of magnitude, thereby resulting in a substantial reduction in convergence time.

As previously explained, since the injected dither has passed through one or more pipeline stages, it cannot simply be subtracted as is. However, since the value of the dither signal is known, e.g., by the dither injection circuit 210, and since the processing performed in the stages is also known, e.g., by design, it is possible to estimate the ideal amplitudes of the unwanted components. Specifically, the subtraction circuit 230 may reconstruct an estimate of the dither residue (that portion of the stage residue which is attributed to the dither signal) as it appears at the stage of interest, then subtract the estimate from the stage residue, leaving only the intended residue as input to the next stage (the stage of interest).

To calculate the estimate, the subtraction circuit 230 may obtain the flash output of each stage (e.g., FD1, FD2, FD3, etc.). Each of these flash outputs may be a multi-bit signal, with the number of bits being variable among the stages. Prior to obtaining the flash outputs, the control circuit 200 may temporarily disconnect the input Vin so that the input is not reflected in the flash outputs. The input may alternatively be manually disconnected. However, the input may be reconnected after the estimates are calculated. When the input is reconnected, the dither signals may continue to be applied as when the input was disconnected, but because of the subtraction only the dither that is relevant to each particular stage is applied to that stage, e.g., subtracting the noise attributed to the dither injected into stages 1 and 2 from the residue of stage 3 leaves only the dither injected into stage 3 as the relevant dither in stage 3. After the dither in stage 3 has performed its intended function, it can be correlated out in the traditional manner using the LMS algorithm or another correlation algorithm. Thus, the example embodiments of the present invention may be used in connection with background based calibration techniques, i.e., calibrations performed while the ADC is actively performing conversion of input.

To calculate the estimate, the subtraction circuit 230 may also obtain the values of the dither signals (e.g., Dith1, Dith2, Dith3, etc.) as well as the processing characteristics of the stages, e.g., the gain values for each stage (G1, G2 and G3, etc.). These gain values correspond to the gain of the amplifier 10d in FIG. 2. Each of the values is obtainable because it is known beforehand, either from design specifications (e.g., gain may be a design specification) or from another circuit component (e.g., dither may be determined by the dither injection circuit 210).

To illustrate how the estimate is calculated, assume there are only three pipeline stages to which dither are applied. These three stages need not be consecutive, i.e., they can be any three stages in the pipeline. However, for illustration purposes, assume they are the first three stages. The residues of the three stages are R1, R2 and R3, respectively; the flash bits are FD1, FD2 and FD3, respectively; and the dithers injected into these stages are Dith1, Dith2 and Dith3, respectively. At the output of stage 3, the residue is composed of Dith3, e.g., the stage 3 calibration signal. The residue is also composed of "noise" components attributed to Dith1 and Dith2, the dither injected into the preceding stages. Therefore, the Dith1 and Dith2 components should be removed in order for the correlation algorithm to converge with respect to stage 3.

In the absence of any input signal, the stage 3 residue is given by:

$$R3=(Dith3)*G3+N3 \quad (1)$$

Where N3 is the noise attributed to the dither signals of stage 1 and stage 2 as presented at the output of stage 3. The following equations show the derivation of the formula for the stage 3 noise:

$$N3=(R2-FD3)*G3=[(Dith2+R1-FD2)*G2-FD3]*G3 \qquad (2)$$

$$N3=[(Dith2+Dith1*G1-FD2)*G2-FD3]*G3 \qquad (3)$$

$$N3=Dith1*G1*G2*G3+(Dith2-FD2)*G2*G3-FD3*G3 \qquad (4)$$

The above equations show that it is possible to estimate the noise based in part on the flash bits of the relevant stages. The subtraction circuit 230 can then subtract this noise value from the residue using analog or digital techniques. For example, N3 may be digitally subtracted using a subtraction unit connected to R3.

It should be apparent that the above discussion can be extended to derive the noise formulas for any stage in the pipeline. For example, the noise N2 attributed to the dither signal of stage 1 as presented at the output of stage 2 is given by:

$$N2=(R1-FD2)*G2=[(Dith1*G1)-FD2]*G2=(Dith1*G1-FD2)*G2$$

$$N2=Dith1*G1*G2-FD2*G2$$

Figure 4:
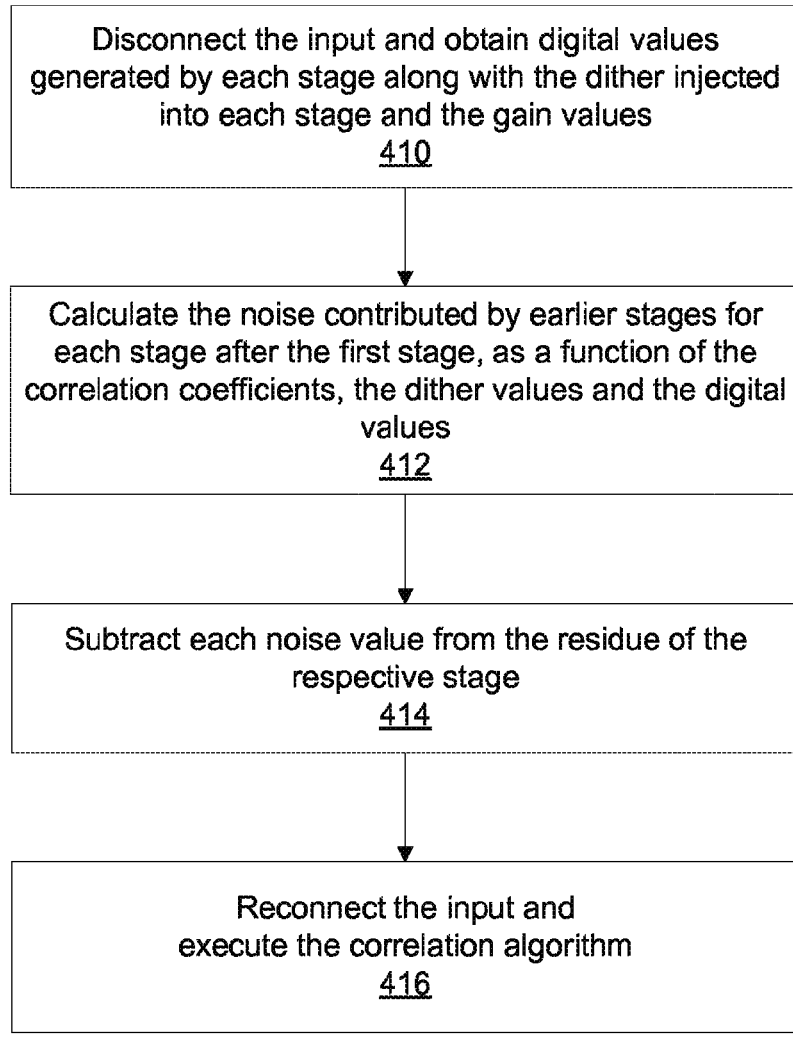
FIG. 4 is a flowchart of a method according to an example embodiment of the present invention.

FIG. 4 is a flowchart of a method 400 according to an example embodiment of the present invention. The method 400 may be performed on a processor of a computer, e.g., the control device 200 or the subtraction circuit 230.

At 410, the input is disconnected and the digital values, i.e., the flash bits, generated by each stage in which dither is injected are obtained along with their corresponding dither values. The gain values may also be obtained and may be read from a memory.

At 412, the noise component of the residue signal is calculated as a function of the dither values, the gain values and the flash bits, as discussed above. The noise may be calculated for each dither-injected stage after the first stage.

At 414, the noise is subtracted from the residue of each respective stage.

At 416, the input is reconnected and the correlation algorithm may be executed.

The method 400 may be repeated to subtract noise from any number of sampling cycles, thereby removing the noise attributed to the dither injected in each of these cycles. As a result, the convergence time of the correlation algorithm is reduced.

An example embodiment of the present invention is directed to one or more processors, which may be implemented using any conventional processing circuit and device or combination thereof, e.g., Personal Computer Central Processing Unit(s), Microprocessors, Field Programmable Gate Arrays (FPGAs), etc., to execute instructions provided, e.g., on a hardware computer-readable medium including any conventional memory device, to perform any of the methods described herein, alone or in combination.

In the preceding specification, the present invention has been described with reference to specific example embodiments thereof. It will, however, be evident that various modifications and changes may be made thereunto without departing from the broader spirit and scope of the present invention as set forth in the claims that follow.

The embodiments described herein may be combined with each other in various combinations. The specification and drawings are accordingly to be regarded in an illustrative rather than restrictive sense.

What is claimed is:

1. A method, comprising:
   at a processor of a pipelined analog-to-digital converter (ADC), injecting a random signal into each of a plurality of stages in the pipeline;
   obtaining digital values generated in response to the random signals; and
   calculating noise components of residue signals in the plurality of stages as a function of the digital values and values of the random signals, wherein the noise components correspond to the random signals.

2. The method of claim 1, further comprising:
   subtracting the noise components from their respective residue signals.

3. The method of claim 2, further comprising:
   applying a correlation algorithm that uses the random signals as input, wherein the correlation algorithm is applied after the subtracting.

4. The method of claim 3, wherein the correlation algorithm is applied to remove the random signals from the outputs of their respective stages so that an overall output of the ADC accurately reflects an input to the pipeline.

5. The method of claim 1, wherein an input signal to the pipeline is disconnected prior to obtaining the digital values.

6. The method of claim 5, wherein the input signal is reconnected after the subtracting.

7. The method of claim 1, wherein the noise components are calculated as a function of gain values that indicate the gain characteristics of the stages.

8. A device, comprising:
   a processor configured to perform the following in a pipelined analog-to-digital converter (ADC) in which a random signal is injected into each of a plurality of stages in the pipeline:
      obtaining digital values generated in response to the random signals; and
      calculating noise components of residue signals in the plurality of stages as a function of the digital values and values of the random signals, wherein the noise components correspond to the random signals.

9. The device of claim 8, wherein the processor is configured to subtract the noise components from their respective residue signals.

10. The device of claim 9, wherein the processor is configured to apply a correlation algorithm that uses the random signals as input, wherein the correlation algorithm is applied after the subtracting.

11. The device of claim 10, wherein the correlation algorithm is applied to remove the random signals from the outputs of their respective stages so that an overall output of the ADC accurately reflects an input to the pipeline.

12. The device of claim 8, wherein processor is configured to disconnect an input signal to the pipeline prior to obtaining the digital values.

13. The device of claim 12, wherein processor is configured to reconnect the input signal after the subtracting.

14. The device of claim 8, wherein the processor calculates the noise components as a function of gain values that indicate the gain characteristics of the stages.

* * * * *